US009728610B1

(12) United States Patent
Wan et al.

(10) Patent No.: US 9,728,610 B1
(45) Date of Patent: Aug. 8, 2017

(54) SEMICONDUCTOR COMPONENT WITH A MULTI-LAYERED NUCLEATION BODY

(71) Applicant: Infineon Technologies Americas Corp., El Segundo, CA (US)

(72) Inventors: Jianwei Wan, Woodbury, MN (US); Scott Nelson, River Falls, WI (US); Srinivasan Kannan, Maplewood, MN (US); Peter Kim, Stillwater, MN (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/017,268

(22) Filed: Feb. 5, 2016

(51) Int. Cl.
| | |
|---|---|
| *H01L 21/338* | (2006.01) |
| *H01L 29/732* | (2006.01) |
| *H01L 31/109* | (2006.01) |
| *H01L 29/205* | (2006.01) |
| *H01L 29/20* | (2006.01) |
| *H01L 29/778* | (2006.01) |
| *H01L 31/0304* | (2006.01) |
| *H01L 31/18* | (2006.01) |
| *H01L 33/00* | (2010.01) |

(Continued)

(52) U.S. Cl.
CPC ........ *H01L 29/205* (2013.01); *H01L 21/0254* (2013.01); *H01L 21/02458* (2013.01); *H01L 29/2003* (2013.01); *H01L 29/778* (2013.01); *H01L 31/03044* (2013.01); *H01L 31/109* (2013.01); *H01L 31/1856* (2013.01); *H01L 33/0025* (2013.01); *H01L 33/0075* (2013.01); *H01L 33/12* (2013.01); *H01L 33/32* (2013.01); *H01S 5/32341* (2013.01)

(58) Field of Classification Search
CPC .......... H01L 21/0254; H01L 21/02458; H01L 21/02538; H01L 21/28575; H01L 27/0605; H01L 29/20; H01L 29/2003; H01L 31/0304; H01L 21/02104; H01L 21/02365; H01L 21/02387; H01L 21/02455; H01L 21/18
See application file for complete search history.

(56) References Cited

U.S. PATENT DOCUMENTS

| | | | |
|---|---|---|---|
| 6,391,748 | B1 | 5/2002 | Temkin |
| 6,649,287 | B2 | 11/2003 | Weeks |

(Continued)

OTHER PUBLICATIONS

Shuji Nakamura and Shigefusa F. Chichibu, Introduction to Nitride Semiconductor Blue Lasers and Light Emitting Diodes, CRC Press, 2000, Chapter. 1.

(Continued)

*Primary Examiner* — Hsien Ming Lee
(74) *Attorney, Agent, or Firm* — Murphy, Bilak & Homiller, PLLC

(57) ABSTRACT

There are disclosed herein various implementations of a semiconductor component with a multi-layered nucleation body and method for its fabrication. The semiconductor component includes a substrate, a nucleation body situated over the substrate, and a group III-V semiconductor device situated over the nucleation body. The nucleation body includes a bottom layer formed at a low growth temperature, and a top layer formed at a high growth temperature. The nucleation body also includes an intermediate layer that is formed substantially continuously using a varying intermediate growth temperature.

16 Claims, 5 Drawing Sheets

(51) Int. Cl.
  *H01L 33/12*  (2010.01)
  *H01L 33/32*  (2010.01)
  *H01S 5/323*  (2006.01)
  *H01L 21/02*  (2006.01)

(56) References Cited

U.S. PATENT DOCUMENTS

| | | |
|---|---|---|
| 6,818,061 B2 | 11/2004 | Peczalski |
| 7,012,016 B2 | 3/2006 | Gwo |
| 2014/0017840 A1* | 1/2014 | Ou .................... H01L 21/0237 |
| | | 438/46 |
| 2014/0361308 A1* | 12/2014 | Yui .................... H01L 21/0254 |
| | | 257/76 |
| 2015/0311290 A1* | 10/2015 | Kang ................ H01L 21/02378 |
| | | 257/77 |
| 2016/0071727 A1* | 3/2016 | Yamamoto ........ H01L 21/02458 |
| | | 438/478 |

OTHER PUBLICATIONS

Raymond S. Pengelly, Simon M. Wood, James, W. Milligan, Scott T. Sheppard, & William L. Pribble, IEEE Transactions on Microwave Theory and Techniques, vol. 60, No. 6, Jun. 2012, p. 1764-1783.

H.M. Liaw, Rajesh Venugopal, Jianwei Wan, and Michael R. Melloch, Solid State Electronics, 45 (2001) 417-421.

\* cited by examiner

SEMICONDUCTOR COMPONENT WITH A MULTI-LAYERED NUCLEATION BODY

BACKGROUND

I. Definition

As used herein, "III-Nitride" or "III-N" refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-N also refers generally to any polarity including but not limited to Ga-polar, N-polar, semi-polar, or non-polar crystal orientations. A III-N material may also include either the Wurtzitic, Zincblende, or mixed polytypes, and may include single-crystal, monocrystalline, polycrystalline, or amorphous structures. Gallium nitride or GaN, as used herein, refers to a III-N compound semiconductor wherein the group III element or elements include some or a substantial amount of gallium, but may also include other group III elements in addition to gallium. A III-N or a GaN transistor may also refer to a composite high voltage enhancement mode transistor that is formed by connecting the III-N or the GaN transistor in cascode with a lower voltage group IV transistor.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as single-crystal or polycrystalline SiC on silicon, silicon on insulator (SOI), separation by implantation of oxygen (SIMOX) process substrates, and silicon on sapphire (SOS), for example.

It is noted that, as used herein, the terms "low voltage" or "LV" in reference to a transistor or switch describes a transistor or switch with a voltage range of up to approximately fifty volts (50V). It is further noted that use of the term "midvoltage" or "MV" refers to a voltage range from approximately fifty volts to approximately two hundred volts (approximately 50V to 200V). Moreover, the term "high voltage" or "HV," as used herein, refers to a voltage range from approximately two hundred volts to approximately twelve hundred volts (approximately 200V to 1200V), or higher.

II. Background Art

Group III-V semiconductors, such as gallium nitride (GaN) and other III-Nitride materials have become increasingly important for the fabrication of optoelectronic devices, such as light-emitting diodes (LEDs), lasers, and ultraviolet (W) photodetectors. In addition, group III-V semiconductors are desirable for use in the fabrication of power switching devices, such as III-Nitride or other group III-V high electron mobility transistors (HEMTs) and Schottky diodes, for example.

Due to the typically small size and high cost of native group III-V substrates, non-native substrates including sapphire, silicon carbide (SiC), and silicon substrates are commonly used to grow the group III-V films providing the group III-V device active layers. Among these non-native substrates, silicon is advantageous because of its large wafer size, low cost, and ease of processing. However, the use of silicon substrates for the fabrication of group III-V devices presents considerable challenges. For example, lattice mismatch and differences in the thermal expansion coefficients between group III-V semiconductors and silicon can undesirably result in high density crystal dislocations and large wafer bow induced by group III-V film stress.

SUMMARY

The present disclosure is directed to a semiconductor component with a multi-layered nucleation body, substantially as shown in and/or described in connection with at least one of the figures, and as set forth in the claims.

DETAILED DESCRIPTION

Figure 1:
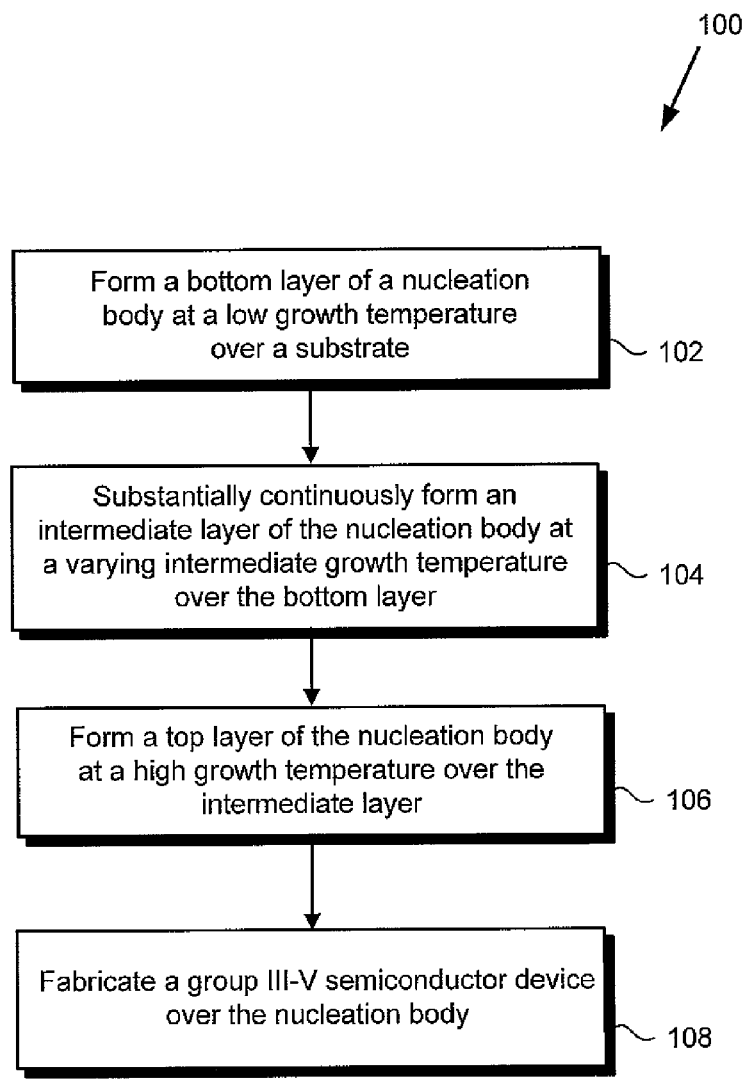
FIG. 1 shows a flowchart presenting an exemplary method for fabricating a semiconductor component with a multi-layered nucleation body, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual to relative dimensions.

As stated above, group III-V semiconductors, such as gallium nitride (GaN) and other III-Nitride materials are important and desirable for the fabrication of optoelectronic and power switching devices. As further stated above, due to disadvantages associated with conventional native III-Nitride or other group III-V substrates, silicon substrates are often used as non-native substrates for group III-V semiconductor devices. However, it has been noted that the use of silicon substrates for the fabrication of group III-V devices presents considerable challenges. For example, lattice mismatch and differences in the thermal expansion coefficients between group III-V semiconductors and silicon can undesirably result in high density crystal dislocations and large wafer bow induced by group III-V film stress.

The present application is directed to a semiconductor component with a multi-layered nucleation body, and a method for fabricating such a component. According to the inventive principles disclosed in the present application, a multi-layered nucleation body suitable for use in the semiconductor component includes a bottom layer formed at a low growth temperature, and a top layer formed at a high growth temperature. In addition, the multi-layered nucleation body includes an intermediate layer, situated between the bottom and top layers, and formed substantially continuously using a varying intermediate growth temperature.

The use of an intermediate layer formed in the manner disclosed herein advantageously enables the subsequent growth of overlying group III-V layers or films having substantially improved crystal quality. That is to say, those subsequently grown to group III-V layers or films have reduced crystal dislocations compared to group III-V layers or films grown over conventional nucleation bodies. As a result, group III-V film stress induced wafer bow may be advantageously reduced in a semiconductor component including an implementation of the multi-layered nucleation body disclosed herein.

Referring to FIG. 1, FIG. 1 shows flowchart 100 presenting an exemplary method for fabricating a semiconductor component with a multi-layered nucleation body. It is noted that certain details and features have been left out of flowchart 100 that are apparent to a person of ordinary skill in the art, in order not to obscure the discussion of the inventive features in the present application.

Figure 2:
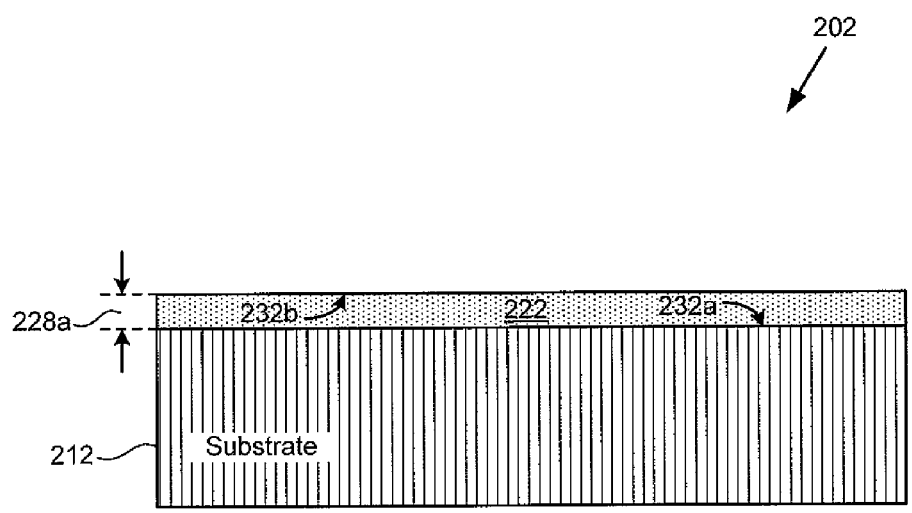
FIG. 2 shows a cross-sectional view of an exemplary structure corresponding to an initial fabrication stage according to one implementation of the flowchart of FIG. 1.
Figure 3:
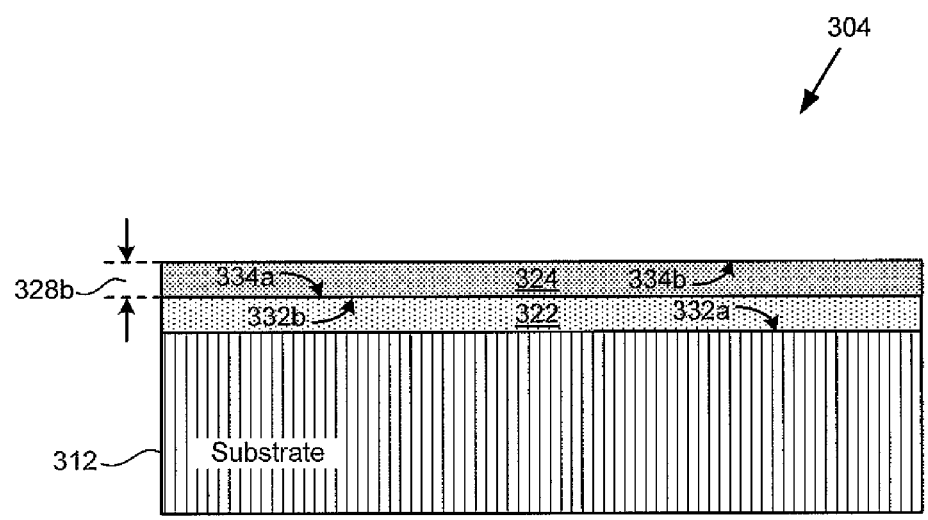
FIG. 3 shows a cross-sectional view of the exemplary structure of FIG. 2 at a subsequent fabrication stage according to one implementation of the flowchart of FIG. 1.
Figure 4A:
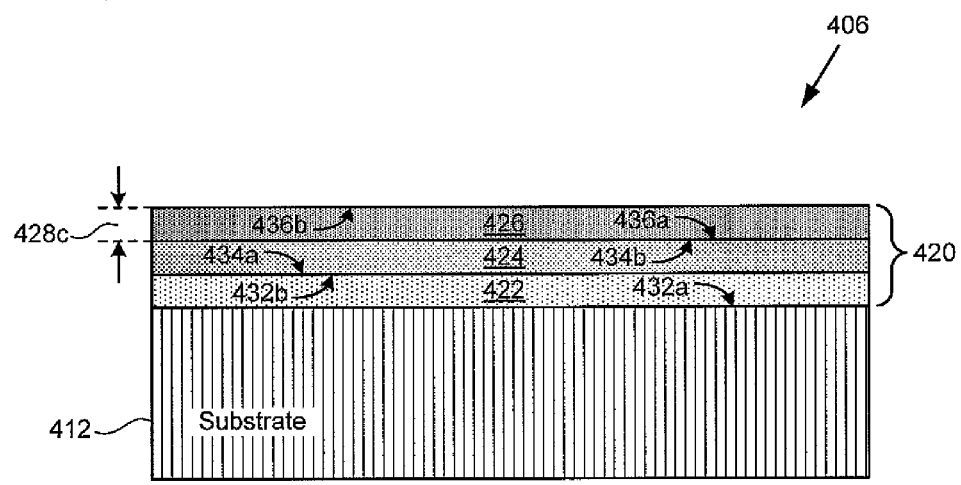
FIG. 4A shows a cross-sectional view of the exemplary structure of FIG. 3 at a subsequent fabrication stage according to one implementation of the flowchart of FIG. 1.
Figure 5:
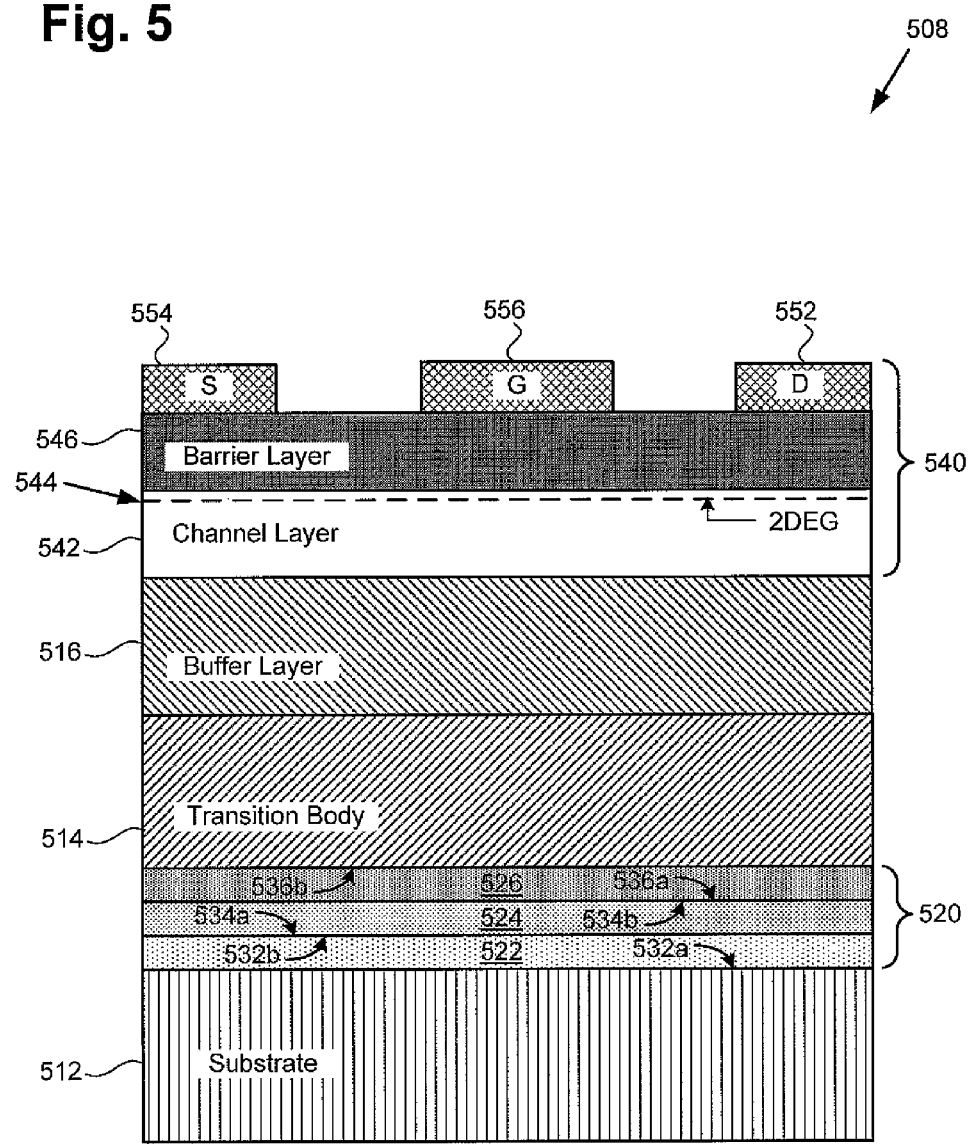
FIG. 5 shows a cross-sectional view of an exemplary semiconductor component with a multi-layered nucleation body, fabricated according to one implementation of the flowchart of FIG. 1.

Continuing to FIG. 2, FIG. 2 shows a cross-sectional view of exemplary structure 202 including substrate 212 and nucleation body bottom layer 222, and corresponding to an initial fabrication stage of a group III-V component with a multi-layered nucleation layer according to one implementation of the flowchart of FIG. 1. Referring to FIGS. 3, 4A, and 5, structures 304, 406, and 508 in those figures show the result of forming a nucleation body intermediate layer (324), forming a nucleation body top layer (426), and fabricating a group III-V semiconductor device (540), respectively, over structure 202.

It is noted that the structures shown in FIGS. 2, 3, 4A, and 5 are provided as specific implementations of the present inventive principles, and are shown with such specificity for the purposes of conceptual clarity. It should also be understood that particular details such as the materials used to form the structures shown in FIGS. 2, 3, 4A, and 5, and the techniques used to produce the various depicted features, are being to provided merely as examples, and should not be interpreted as limitations.

Referring to FIG. 2 in conjunction with FIG. 1, flowchart 100 begins with forming bottom layer 222 of a nucleation body at a low growth temperature over substrate 212 (action 102). According to the exemplary implementation depicted by structure 202, in FIG. 2, substrate 212 may include any material suitable for use as a support substrate for fabrication of a group III-V device. For example, substrate 212 may be formed of a group IV material such as silicon (Si), or may be a silicon carbide (SiC) or sapphire substrate. Moreover, although substrate 212 is shown as a substantially unitary substrate in FIG. 2, in other implementations, substrate 212 may correspond to a composite substrate, such as a silicon on insulator (SOI) substrate, a separation by implantation of oxygen (SIMOX) process substrate, a silicon on sapphire (SOS) substrate, or a single-crystal or polycrystalline SiC on silicon substrate, for example.

As shown by structure 202, nucleation body bottom layer 222 has bottom surface 232a, top surface 232b, and thickness 228a, and is formed so as to be situated over substrate 212. For example, in one implementation, nucleation body bottom layer 222 may be formed directly on substrate 212 such that bottom surface 232a of nucleation body bottom layer 222 adjoins substrate 212. Nucleation body bottom layer 222 may be formed of a group III-V semiconductor material, such as a III-Nitride semiconductor material, for instance. As a specific example, nucleation body bottom layer 222 may be an aluminum nitride (AlN) layer formed on or over substrate 212 using any of molecular-beam epitaxy (MBE), metalorganic chemical vapor deposition (MOCVD), or hydride vapor phase epitaxy (HVPE), to name a few suitable techniques.

According to the exemplary implementation shown by FIGS. 1 and 2, nucleation body bottom layer 222 is formed at a low growth temperature. For example, nucleation body bottom layer 222 may be formed at a low growth temperature in a temperature range between approximately six hundred and approximately one thousand degrees Celsius (600-1,000° C.), such as an approximately 900-1,000° C. low growth temperature range. As a result, nucleation body bottom layer 222 may be partially or substantially amorphous, and may be characterized as having a relatively poor crystal quality.

As further shown by structure 202, nucleation body bottom layer 222 is formed to thickness 228a. Thickness 228a may be in a range from approximately one nanometer to approximately one hundred nanometers (1.0-100 nm), for instance. In one implementation, for example, nucleation body bottom layer 222 may be formed to thickness 228a of approximately 10 nm at a low growth temperature of approximately 950° C.

Moving to FIG. 3 with continued reference to FIG. 1, flowchart 100 continues with substantially continuously forming intermediate layer 324 of the nucleation body at a varying intermediate growth temperature over bottom layer 322 (action 104). It is noted that the features in FIG. 3 identified by reference numbers corresponding to those shown in FIG. 2, correspond respectively to those previously described features. In other words, substrate 312 and nucleation body bottom layer 322, in FIG. 3, correspond respectively to substrate 212 and nucleation body bottom layer 222, in FIG. 2, and may share any of the characteristics attributed to those corresponding features in the present application.

As shown by structure 304, nucleation body intermediate layer 324 has bottom surface 334a, top surface 334b, and thickness 328b, and is formed so as to be situated over nucleation body bottom layer 322. For example, in one implementation, nucleation body intermediate layer 324 may be formed directly on nucleation body bottom layer 322 such that bottom surface 334a of nucleation body intermediate layer 324 adjoins top surface 332b of nucleation body bottom layer 322.

Like nucleation body bottom layer 322, nucleation body intermediate layer 324 may be formed of a III-Nitride or other group III-V semiconductor material. For instance, nucleation body intermediate layer 324 may be an MN layer formed on or over nucleation body bottom layer 322 using any of MBE, MOCVD, or HYPE.

According to the exemplary implementation shown by FIGS. 1 and 3, nucleation body intermediate layer 324 is formed substantially continuously at a varying intermediate growth temperature. In other words, nucleation body intermediate layer 324 is grown as the growth temperature in its growth environment is changed, for example increased. The varying intermediate growth temperature used for formation of nucleation body intermediate layer 324 will be described in greater detail below by reference to FIG. 4B. As further shown by structure 304, nucleation body intermediate layer 324 is formed to thickness 328b. Thickness 328b may be in a range from 30 nm to approximately 50 nm, for example.

Continuing now to FIG. 4A with further reference to FIG. 1, flowchart 100 continues with forming top layer 426 of nucleation body 420 at a high growth temperature over intermediate layer 424 of nucleation body 420 (action 106). It is noted that the features in FIG. 4A identified by reference numbers corresponding to those shown in FIGS. 2 and 3, correspond respectively to those previously described features. In other words, substrate 412, nucleation bottom layer 422 of nucleation body 420, and intermediate layer 424 of nucleation body 420 correspond respectively to substrate 212/312, nucleation body bottom layer 222/322, and nucleation body intermediate layer 324, in FIGS. 2 and 3, and may share any of the characteristics attributed to those corresponding features in the present application.

As shown by structure 406, top layer 426 of nucleation body 420 has bottom surface 436a, top surface 436b, and thickness 428c, and is formed so as to be situated over intermediate layer 424 of nucleation body 420. For example, in one implementation, top layer 426 may be formed directly on intermediate layer 424 such that bottom surface 436a of top layer 426 adjoins top surface 434b of intermediate layer 424.

Like bottom layer 422 and intermediate layer 424 of nucleation body 420, top layer 426 may be formed of a III-Nitride or other group III-V semiconductor material. For instance, top layer 426 may be an AlN layer formed on or over intermediate layer 424 using any of MBE, MOCVD, or HVPE. Thus, in one implementation, nucleation body 420 including bottom layer 422, intermediate layer 424, and top layer 426 may be a multi-layered AN body situated on or over substrate 412.

According to the exemplary implementation shown by FIGS. 1 and 4A, top layer 426 of nucleation body 420 is formed at a high growth temperature. For example, top layer 426 may be formed at a high growth temperature of less than or substantially equal to 1,100° C., such as a high growth temperature in a temperature range from approximately 1080-1,100° C. As a result, and in contrast to bottom layer 422 of nucleation body 420, top layer 426 of nucleation body 420 may be characterized as having a relatively good crystal quality.

As further shown by structure 406, top layer 426 of nucleation body 420 is formed to thickness 428c. Thickness 428c may be in a range from approximately 100 nm to approximately 600 nm, for instance. In one implementation, for example, top layer 426 may be formed to thickness 428c of approximately 350 nm at a high growth temperature of up to approximately 1,100° C.

Figure 4B:
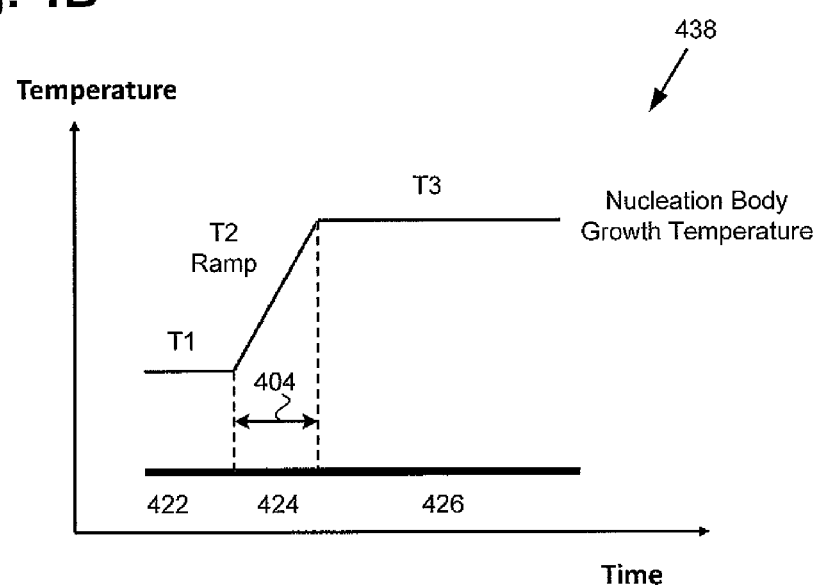
FIG. 4B is a graph showing exemplary growth temperatures used during the fabrication stages represented by the exemplary structures of FIGS. 2, 3, and 4A, according to one implementation of the flowchart of FIG. 1.

Referring to FIG. 4B, FIG. 4B shows graph 438 displaying exemplary growth temperatures used during formation of nucleation body 420, according to one implementation of the flowchart of FIG. 1. As shown by graph 438, bottom layer 422 of nucleation body 420 is formed at substantially constant low growth temperature T1, while top layer 426 of nucleation body is formed at substantially constant high growth temperature T3. As further shown by graph 438, intermediate layer 424 of nucleation body 420 is formed using varying intermediate growth temperature T2 during intermediate interval 404. Moreover, and as also shown by graph 438, formation of intermediate layer 424 is substantially continuous as intermediate growth temperature T2 varies.

In one implementation, as shown by FIG. 4B, intermediate layer 424 may be continuously grown as varying intermediate growth temperature T2 increases from low growth temperature T1 to high growth temperature T3. For example, in such an implementation, varying intermediate growth temperature T2 may vary across a range of approximately 150° C. as varying intermediate growth temperature T2 increases from low growth temperature T1 to high growth temperature T3. Moreover, in one implementations, varying intermediate growth temperature T2 may increase from low growth temperature T1 to high growth temperature T3 during intermediate interval 404 of approximately five minutes.

However, in other implementations, varying intermediate growth temperature T2 may vary in other ways. For example, in some implementations, varying intermediate growth temperature T2 may vary between low growth temperature T1 and high growth temperature T3 by fluctuating as varying intermediate growth temperature T2 is increased between low growth temperature T1 and high growth temperature T3. That is to say, varying intermediate growth temperature T2 may rise and fall as varying intermediate growth temperature T2 is increased between low growth temperature T1 and high growth temperature T3.

Moreover, formation of intermediate layer 424, while continuous, may not occur during the entirety of intermediate interval 404. In other words, in some implementations, varying intermediate growth temperature T2 may vary across a range of temperatures between a lower temperature greater than or substantially equal to low growth temperature T1 and/or a higher growth temperature less than or substantially equal to high growth temperature T3.

Continuing to FIG. 5 with further reference to FIG. 1, flowchart 100 continues with fabricating group III-V semiconductor device 540 over nucleation body 520 (action 108). FIG. 5 shows a cross-sectional view of exemplary semiconductor component 508 including group III-V semiconductor device 540 situated over multi-layered nucleation body 520. In addition to group III-V semiconductor device 540 and nucleation body 520, semiconductor component also includes substrate 512, transition body 514, and buffer layer 516.

It is noted that the features in FIG. 5 identified by reference numbers corresponding to those shown in FIGS. 2, 3, and 4A, correspond respectively to those previously described features. In other words, substrate 512, and nucleation body 520 including bottom layer 522, intermediate layer 524, and top layer 526 correspond respectively to substrate 212/312/412, and nucleation body 420 including bottom layer 222/322/422, intermediate layer 324/424, and top layer 426, in FIGS. 2, 3, and 4A, and may share any of the characteristics attributed to those corresponding features in the present application.

It is further noted that although group III-V semiconductor device 540 is depicted as a high electron mobility transistor (HEMT), in FIG. 5, that representation is merely exemplary. In other implementations, semiconductor component 508 including multi-layered nucleation body 520 may be suitably adapted to provide another type of group III-V semiconductor device corresponding to group III-V semiconductor device 540. For example, in other implementations, group III-V semiconductor device 540 may take the form of another type of group III-V power switching device, such as any type of heterostructure field-effect transistor (HFET), or a Schottky diode. Alternatively, in some implementations, group III-V semiconductor device 540 may take the form of an optoelectronic device, such as a light-emitting diode (LED), laser, or ultraviolet (UV) photodetector, for example.

Nevertheless, for merely exemplary purposes, group III-V semiconductor device 540 will be described as a III-Nitride HEMT (hereinafter "HEMT 540") including active layers in the form of gallium nitride (GaN) channel layer 542 and overlying aluminum gallium nitride (AlGaN) barrier layer 546, drain electrode 552, source electrode 554, and gate 556. As shown in FIG. 5, in its on-state, HEMT 540 includes two-dimensional electron gas (2DEG) 544 providing a low resistance conduction channel between drain electrode 552 and source electrode 554. As further shown in FIG. 5, 2DEG 554 is generated at or near the interface of the active layers of HEMT 540, i.e., GaN channel layer 542 and AlGaN barrier layer 546 having a larger bandgap than that of GaN channel layer 542.

Active GaN channel layer 542 and AlGaN barrier layer 544 of HEMT 540 may be formed over nucleation body 520 using any of a number of known growth techniques. For example, GaN channel layer 542 and AlGaN barrier layer 544 may be formed using MBE, MOCVD, or HVPE, to name a few suitable techniques.

As shown in FIG. 5, in implementations in which substrate 512 is a non-native substrate for fabrication of a group III-V semiconductor device, such as HEMT 540, transition body 514 may be formed between nucleation body 520 and the group III-V semiconductor device. As a specific example, where substrate 512 is a silicon substrate, transition body 514 may correspond to multiple distinguishable layers helping to mediate the lattice transition from substrate 512 to the active layers of HEMT 540 represented by GaN channel layer 542 and AlGaN barrier layer 546.

In one implementation, transition body 514 may include a series of AlGaN layers having a progressively reduced aluminum content relative to their gallium content, until a suitable transition to overlying buffer layer 516 is achieved. Moreover, in some implementations, transition body 514 may take the form of a compositionally graded body having different AlGaN, or other III-Nitride or group III-V alloy compositions at respective top and bottom surfaces. Transition body 514 may be formed over nucleation body 520 using any of MBE, MOCVD, or HVPE, for example.

As further shown in FIG. 5, buffer layer 516 is situated between transition body 514 and HEMT 540. In implementations in which HEMT 540 is a GaN based HEMT, for example, as described above, buffer layer 516 may be implemented as an intrinsic GaN layer. Like transition body 514, buffer layer 516 may be formed using any of MBE, MOCVD, or HVPE.

According to the exemplary implementation shown in FIG. 5, nucleation body 520 advantageously increases a crystal lattice match between active GaN channel layer 542 of HEMT 540 and buffer layer 516 in semiconductor component 508. Moreover, nucleation body 520 substantially improves group III-V crystal quality in semiconductor component 508 when compared to semiconductor components using conventional nucleation bodies. For example, in implementations in which a group III-V semiconductor device corresponding to HEMT 540 is implemented as a GaN based device in semiconductor component 508 including nucleation body 520, GaN crystal quality is significantly improved. Specifically, full width at half maximum (FWHM) of GaN(002) and GaN(101) peaks may be reduced by thirty to fifty percent (30%-50%) based on x-ray diffraction (XRD) rocking curve measurements.

Thus, the present application discloses a semiconductor component including a multi-layered nucleation body that advantageously enables the growth of group III-V layers or films having substantially improved crystal quality. That is to say, those group III-V layers or films have reduced crystal dislocations compared to group III-V layers or films grown over conventional nucleation bodies. As a result, group III-V film stress induced wafer bow may be advantageously reduced in a semiconductor component including an implementation of the multi-layered nucleation body disclosed herein.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor component comprising:
   a substrate;
   a nucleation body situated on said substrate;
   a transition body situated on said nucleation body;
   a buffer layer situated on said transition body;
   a group III-V semiconductor device situated over said buffer layer, said semiconductor device comprising a channel layer situated on said buffer layer, and a barrier layer situated on said channel layer;
   wherein said nucleation body includes a bottom layer that is at least partially amorphous, and a top layer that is at least partially crystalline;
   said nucleation body further including an intermediate layer of a thickness between 30 nm and 50 nm sandwiched between said bottom layer and said top layer.

2. The semiconductor component of claim 1, wherein said nucleation body increases a crystal lattice match between an active layer of said group III-V semiconductor device and said buffer layer in said semiconductor component.

3. The semiconductor component of claim 1, wherein said nucleation body comprises aluminum nitride (AlN).

4. The semiconductor component of claim 1, wherein said group III-V semiconductor device comprises a group III-V heterostructure field-effect transistor (HFET).

5. The semiconductor component of claim 1, wherein said group III-V semiconductor device comprises a III-Nitride high electron mobility transistor (HEMT).

6. The semiconductor component of claim 1, wherein said group III-V semiconductor device comprises a group III-V optoelectronic device.

7. A method for fabricating a semiconductor component, said method comprising:
   forming a bottom layer of a nucleation body at a low growth temperature on a substrate;
   forming, substantially continuously, an intermediate layer of said nucleation body at a varying intermediate growth temperature on said bottom layer;
   forming a top layer of said nucleation body at a high growth temperature on said intermediate layer;

forming a transition body on said top layer of said nucleation body;

forming a buffer layer on said transition body;

fabricating a group III-V semiconductor device on said buffer layer, said semiconductor device comprising a channel layer formed on said buffer layer and a barrier layer formed on said channel layer;

wherein said high growth temperature is higher than both said intermediate temperature and said low growth temperature;

wherein said intermediate growth temperature is lower than said high growth temperature and higher than said low growth temperature.

8. The method of claim 7, wherein said varying intermediate growth temperature varies between said low growth temperature and said high growth temperature.

9. The method of claim 7, wherein said varying intermediate growth temperature increases from said low growth temperature to said high growth temperature.

10. The method of claim 7, wherein said nucleation body increases a crystal lattice match between an active layer of said group III-V semiconductor device and a said buffer layer in said semiconductor component.

11. The method of claim 7, wherein said nucleation body comprises aluminum nitride (AlN).

12. The method of claim 7, wherein said group III-V semiconductor device comprises a group III-V heterostructure field-effect transistor (HFET).

13. The method of claim 7, wherein said group III-V semiconductor device comprises a III-Nitride high electron mobility transistor (HEMT).

14. The method of claim 7, wherein said group III-V semiconductor device comprises a group III-V optoelectronic device.

15. The method of claim 7, wherein said low growth temperature is in a temperature range between approximately nine hundred and approximately one thousand degrees Celsius.

16. The method of claim 7, wherein said high growth temperature is in a temperature range between approximately one thousand eighty and approximately eleven hundred degrees Celsius.

* * * * *